United States Patent
Weathers et al.

(10) Patent No.: US 9,135,106 B2
(45) Date of Patent: Sep. 15, 2015

(54) READ LEVEL ADJUSTMENT USING SOFT INFORMATION

(71) Applicant: STEC, Inc., Santa Ana, CA (US)

(72) Inventors: Anthony D. Weathers, San Diego, CA (US); Richard D. Barndt, San Diego, CA (US); Xinde Hu, San Jose, CA (US)

(73) Assignee: HGST TECHNOLOGIES SANTA ANA, INC., Santa Ana, CA (US)

( * ) Notice: Subject to any disclaimer, the term of this patent is extended or adjusted under 35 U.S.C. 154(b) by 125 days.

(21) Appl. No.: 13/899,447

(22) Filed: May 21, 2013

(65) Prior Publication Data

US 2013/0318422 A1    Nov. 28, 2013

Related U.S. Application Data

(60) Provisional application No. 61/650,419, filed on May 22, 2012.

(51) Int. Cl.
| | | |
|---|---|---|
| *G06F 11/08* | (2006.01) | |
| *G06F 11/10* | (2006.01) | |
| *G11C 16/34* | (2006.01) | |
| *G06F 12/02* | (2006.01) | |
| *G06F 11/07* | (2006.01) | |
| *G06F 11/00* | (2006.01) | |
| *H03M 13/39* | (2006.01) | |
| *G11C 11/56* | (2006.01) | |
| *G11C 16/26* | (2006.01) | |
| *G11C 29/02* | (2006.01) | |
| *G11C 16/00* | (2006.01) | |

(52) U.S. Cl.
CPC ............... *G06F 11/08* (2013.01); *G06F 11/00* (2013.01); *G06F 11/076* (2013.01); *G06F 11/1068* (2013.01); *G06F 11/1072* (2013.01); *G06F 12/0246* (2013.01); *G11C 11/5642* (2013.01); *G11C 16/26* (2013.01); *G11C 16/34* (2013.01); *G11C 16/3404* (2013.01); *G11C 16/3454* (2013.01); *G11C 29/021* (2013.01); *G11C 29/028* (2013.01); *H03M 13/3927* (2013.01); *G11C 16/00* (2013.01)

(58) Field of Classification Search
CPC . G06F 11/1068; G06F 11/08; G06F 11/1072; G06F 11/00; G06F 11/076; G06F 12/0246; G11C 29/028; G11C 11/5642; G11C 16/26; G11C 16/3454; G11C 16/00; G11C 16/3404; G11C 16/34; H03M 13/3927
USPC .......................... 714/763, 773, 780, 718, 721; 365/189.011, 185.22, 185.18, 185.03, 365/200, 185.33, 185.24
See application file for complete search history.

(56) References Cited

U.S. PATENT DOCUMENTS

| | | | | |
|---|---|---|---|---|
| 7,656,707 | B2 * | 2/2010 | Kozlov | 365/185.05 |
| 7,966,546 | B2 * | 6/2011 | Mokhlesi et al. | 714/773 |
| 7,966,550 | B2 * | 6/2011 | Mokhlesi et al. | 714/780 |
| 8,149,623 | B2 * | 4/2012 | Uchikawa et al. | 365/185.18 |
| 8,185,787 | B1 * | 5/2012 | Marrow et al. | 714/721 |

(Continued)

*Primary Examiner* — John J Tabone, Jr.
(74) *Attorney, Agent, or Firm* — McDermott Will & Emery LLP

(57) ABSTRACT

A method for calibrating read levels in a flash memory device is provided. The method includes receiving read information from flash memory in response to a read command, assigning soft information to the received read information, determining an error signal based on the assigned soft information, determining a read level offset based on the error signal, and adjusting a read level in the flash memory by the determined read level offset.

19 Claims, 9 Drawing Sheets

(56) References Cited

U.S. PATENT DOCUMENTS

| | | | |
|---|---|---|---|
| 8,213,236 B1* | 7/2012 | Wu et al. | 365/185.24 |
| 8,549,380 B2* | 10/2013 | Motwani | 714/763 |
| 8,737,136 B2* | 5/2014 | Cometti | 365/185.22 |
| 8,793,543 B2* | 7/2014 | Tai et al. | 714/718 |
| 8,848,438 B2* | 9/2014 | Hu | 365/185.03 |
| 8,938,658 B2* | 1/2015 | Tai et al. | 714/769 |
| 2007/0171730 A1* | 7/2007 | Ramamoorthy et al. | 365/185.33 |
| 2008/0043356 A1* | 2/2008 | Jin et al. | 360/39 |
| 2008/0263266 A1* | 10/2008 | Sharon et al. | 711/103 |
| 2011/0090734 A1* | 4/2011 | Burger et al. | 365/185.03 |
| 2011/0103527 A1* | 5/2011 | Liu et al. | 375/341 |
| 2012/0254699 A1* | 10/2012 | Ruby et al. | 714/773 |
| 2013/0047044 A1* | 2/2013 | Weathers et al. | 714/708 |
| 2013/0117616 A1* | 5/2013 | Tai et al. | 714/718 |
| 2013/0163328 A1* | 6/2013 | Karakulak et al. | 365/185.2 |
| 2013/0185598 A1* | 7/2013 | Haratsch et al. | 714/42 |
| 2013/0290612 A1* | 10/2013 | Weathers et al. | 711/103 |
| 2014/0047269 A1* | 2/2014 | Kim | 714/16 |
| 2014/0157086 A1* | 6/2014 | Sharon et al. | 714/773 |

* cited by examiner

READ LEVEL ADJUSTMENT USING SOFT INFORMATION

This application claims the benefit of U.S. Provisional Application No. 61/650,419 filed May 22, 2012, entitled "READ LEVEL ADJUSTMENT USING SOFT INFORMATION," which is incorporated herein by reference.

BACKGROUND

Flash memory devices store information by placing charge on a floating gate. For example, single-level cell (SLC) flash devices store binary information in a cell by either programming a level of charge in the cell or leaving the cell erased. In multi-level cell (MLC) flash devices, multiple bits are stored in a cell by placing one of several possible levels of charge on the cell or leaving the cell erased. During a read operation, a series of voltage comparisons allows an estimate of charge levels for a particular cell. Each level is associated with a binary pattern. By estimating the charge level, an estimate of the bit pattern for each charge level can be made.

In some instances, the threshold voltage for certain cells may be very close to the read levels that were used in the comparison of different levels. As a result, the read levels that are used for the comparisons must be chosen accurately in order to minimize the number of errors. The optimal read levels change as a function of time depending on the state of the flash. Because the true state of the flash is almost never known, a singular optimal placement of the read levels may not be possible. Thus, in order to improve the error rate it is useful to have not just the bit estimates, but also an indication of the reliability of each estimate. This reliability measure is called "soft information" and it is not provided directly from the flash memory.

SUMMARY

According to aspects of the subject technology, a method for calibrating read levels in a flash memory device is provided. The method includes receiving read information from flash memory in response to a read command, assigning soft information to the received read information, determining an error signal based on the assigned soft information, determining a read level offset based on the error signal, and adjusting a read level in the flash memory by the determined read level offset.

According to aspects of the subject technology, a flash memory device is provided. The flash memory device includes flash memory and a controller. The controller is configured to send a read command to the flash memory, receive read information from the flash memory in response to the read command, assign soft information to the received read information, determine an error signal based on the assigned soft information, determine a read level offset based on the error signal, and adjust a read level in the flash memory by the determined read level offset.

According to aspects of the subject technology, a non-transitory machine-readable medium having instructions stored thereon which, when executed by a processor, cause the processor to perform operations is provided. The operations include: receiving read information from a plurality of cells in flash memory in response to a read command, assigning a log likelihood ratio to the received read information for each of the plurality of cells in the flash memory, determining an error signal based on the assigned log likelihood ratios, determining a read level offset based on the error signal, and adjusting a read level in the flash memory by the determined read level offset.

It is understood that other configurations of the subject technology will become readily apparent to those skilled in the art from the following detailed description, wherein various configurations of the subject technology are shown and described by way of illustration. As will be realized, the subject technology is capable of other and different configurations and its several details are capable of modification in various other respects, all without departing from the scope of the subject technology. Accordingly, the drawings and detailed description are to be regarded as illustrative in nature and not as restrictive.

DETAILED DESCRIPTION

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, the subject technology may be practiced without these specific details. In some instances, structures and components are shown in block diagram form in order to avoid obscuring the concepts of the subject technology. Like components are labeled with identical reference numbers for ease of understanding.

The subject technology provides a mechanism for using soft information from flash memory to estimate read level locations, with respect to optimal read level locations. In certain aspects, the estimate will comprise a prediction as to whether the read levels are higher or lower than the optimal location. By accurately predicting errors in read level locations, optimal read level locations can be dynamically tracked, without requiring design changes to existing flash memory.

Figure 1:
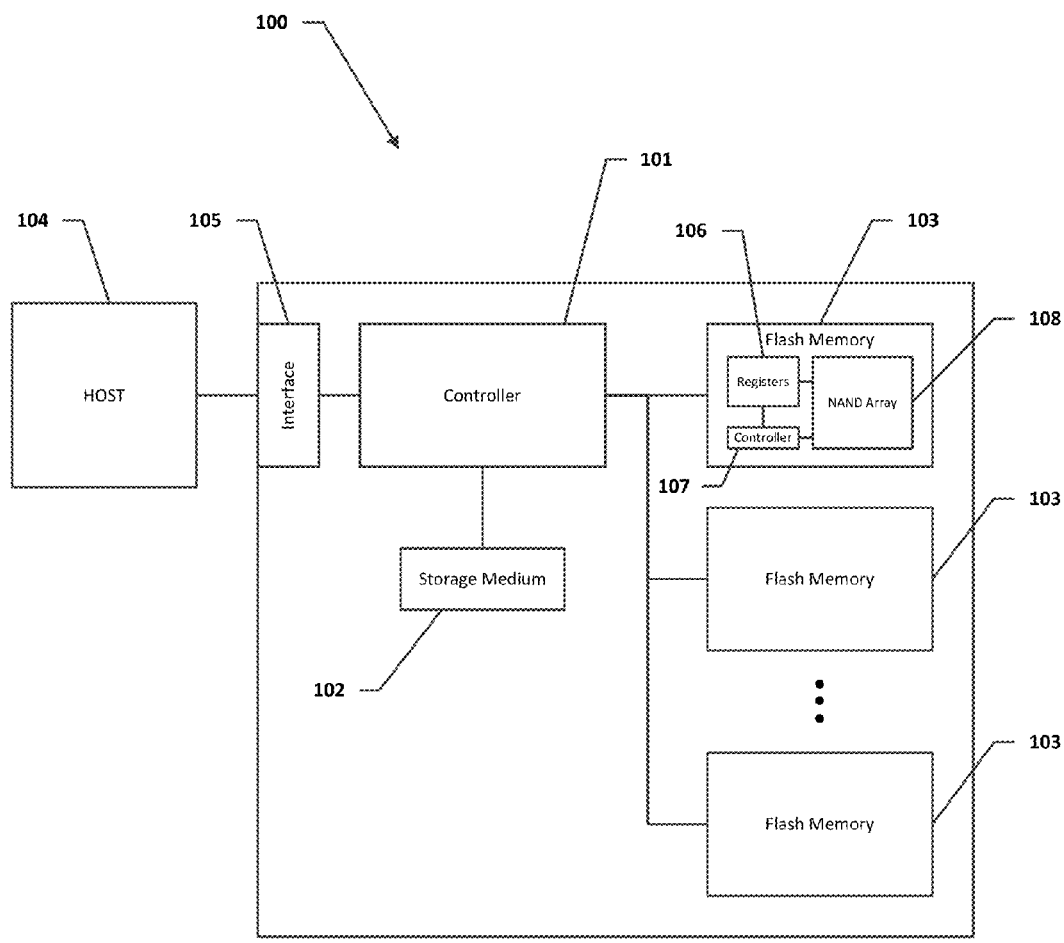
FIG. 1 is a block diagram illustrating components of a flash memory device according to aspects of the subject technology.

FIG. 1 is a block diagram illustrating example components of a flash memory device 100 (for example, a solid state drive) according to aspects of the subject technology. Flash memory device 100 may include data storage controller 101, storage medium 102, and flash memory 103. Controller 101 may use storage medium 102 for temporary storage of data and information used to manage flash memory device 100. Controller 101 may include several internal components (not shown) such as, a read-only memory, a flash component interface (for example, a multiplexer to manage instruction and data transport along a serial connection to flash memory 103), an I/O interface, an error correction code (ECC) module, and the like. In some aspects, all of these elements of controller 101 may be integrated into a single chip. In other aspects, these elements may be separated into two or more modules or chips.

Controller 101 may also include one or more processors configured to execute code or instructions to perform the operations and functionality described herein, manage request flow and address mappings, and to perform calculations and generate commands. The processor of controller 101 may be configured to monitor and control the operation of the components in data storage controller 101. The processor may be a general-purpose microprocessor, a microcontroller, a digital signal processor (DSP), an application specific integrated circuit (ASIC), a field programmable gate array (FPGA), a programmable logic device (PLD), a controller, a state machine, gated logic, discrete hardware components, or a combination of the foregoing. One or more sequences of instructions may be stored as firmware on ROM within controller 101 and/or its processor. One or more sequences of instructions may be software stored and read from storage medium 102, flash memory 103, or received from host device 104 (for example, via host interface 105). ROM, storage medium 102, flash memory 103, represent examples of machine or computer readable media on which instructions/code executable by controller 101 and/or its processor may be stored. Machine or computer readable media may generally refer to any non-transitory medium or media used to provide instructions to controller 101 and/or its processor, including both volatile media, such as dynamic memory used for storage media 102 or for buffers within controller 101, and non-volatile media, such as electronic media, optical media, and magnetic media.

In some aspects, controller 101 is configured to store data received from a host device 104 in flash memory 103 in response to a write command from host device 104. Controller 101 is further configured to read data stored in flash memory 103 and to transfer the read data to host device 104 in response to a read command from host device 104. As will be described in more detail below, controller 101 is configured to calibrate read levels used in flash memory 103 based on soft information obtained during read and decoding operations.

Host device 104 represents any device configured to be coupled to flash memory device 100 and to store data in flash memory device 100. Host device 104 may be a computing system such as a personal computer, a server, a workstation, a laptop computer, PDA, smart phone, and the like. Alternatively, host device 104 may be an electronic device such as a digital camera, a digital audio player, a digital video recorder, and the like.

In some aspects, storage medium 102 represents volatile memory used to temporarily store data and information used to manage flash memory device 100. According to one aspect of the subject technology, storage medium 102 is random access memory (RAM) such as double data rate (DDR) RAM. Other types of RAM also may be used to implement storage medium 102. Memory 102 may be implemented using a single RAM module or multiple RAM modules. While storage medium 102 is depicted as being distinct from controller 101, those skilled in the art will recognize that storage medium 102 may be incorporated into controller 101 without departing from the scope of the subject technology. Alternatively, storage medium 102 may be a non-volatile memory such as a magnetic disk, flash memory, peripheral SSD, and the like.

As further depicted in FIG. 1, flash memory device 100 may also include host interface 105. Host interface 105 is configured to be coupled to host device 104, to receive data from host device 104 and to send data to host device 104. Host interface 105 may include both electrical and physical connections for operably coupling host device 104 to controller 101, for example, via the I/O interface of controller 101. Host interface 105 is configured to communicate data, addresses, and control signals between host device 104 and controller 101. Alternatively, the I/O interface of controller 101 may include and/or be combined with host interface 105. Host interface 105 may be configured to implement a standard interface, such as Serial-Attached SCSI (SAS), Fiber Channel interface, PCI Express (PCIe), SATA, USB, and the like. Host interface 105 may be configured to implement only one interface. Alternatively, host interface 105 (and/or the I/O interface of controller 101) may be configured to implement multiple interfaces, which are individually selectable using a configuration parameter selected by a user or programmed at the time of assembly. Host interface 105 may include one or more buffers for buffering transmissions between host device 104 and controller 101.

Flash memory 103 represents non-volatile memory for storing data. According to aspects of the subject technology, flash memory 103 includes, for example, a NAND flash memory. Flash memory 103 may include a single flash memory device or chip, or, as depicted by FIG. 1, may include multiple flash memory devices or chips arranged in multiple channels. Flash memory 103 is not limited to any particular capacity or configuration. For example, the number of physical blocks, the number of physical pages per physical block, the number of sectors per physical page, and the size of the sectors may vary within the scope of the subject technology.

Flash memory 103 may comprise single-level cell (SLC) memory, multi-level cell (MLC) memory and/or three-level cell (TLC) memory device. In some aspects, flash memory 103 may comprise one or more hybrid memory devices that can function in one or more of a SLC, MLC or TLC mode.

Flash memory may have a standard interface specification. This standard ensures that chips from multiple manufacturers can be used interchangeably. The interface may further hide the inner working of the flash memory and return only internally detected bit values for data. The interface of flash memory 103 may be used to access one or more internal registers 106 and an internal flash controller 107. In some aspects, registers 106 may include address, command, control, and/or data registers, which internally retrieve and output the necessary data to and from a NAND memory cell array 108. For example, a data register may include data to be stored in memory array 108, or data after a fetch from memory array 108, and may also be used for temporary data storage and/or act like a buffer. An address register may store the memory address from which data will be fetched to host 104 or the address to which data will be sent and stored. In some aspects, a command register may be included to control parity, interrupt control, and/or the like. In some aspects, internal flash controller 107 is accessible via a control register to control the general behavior of flash memory 103. Internal flash controller 107 and/or the control register may control read levels, program verify levels, number of stop bits, word length, receiver clock source, and may also control switching the addressing mode, paging control, coprocessor control, and the like.

As indicated above, controller 101 may include an ECC module. The ECC module represents one or more components configured to encode data received from a host to generate code words to be written to the flash memory array and to decode code words read from the flash memory before sending the decoded data to the host. In some implementations, the ECC module can comprise one or more memory devices and/or one or more processing units used to perform error correction (e.g., using LDPC or turbo codes).

In certain implementations, the ECC module may be configured to obtain soft information using multiple read operations to read data from the flash memory. The subject technology is not limited to any number of read operations for obtaining soft information. For example, three read operations, five read operations, seven read operations, etc. may be used. Soft information can be used for error correction decoding (e.g., using soft LDPC decoding techniques). The ECC module may include or be configured to implement a log-likelihood ratio (LLR) generator (not shown) for generating soft information in the form of LLRs.

In one example, the threshold voltage ($V_T$) axis of level distribution curves is divided into regions and LLR values are assigned to each region (e.g., during a calibration phase). During operation, the region of each cell in the flash memory being read is determined using multiple read operations noted above and an LLR value is assigned based on the determined region. The multiple read operations used to determine the respective regions for cells being read may be implemented as an iterative process. For example, controller 101 may issue a read command to flash memory 103 for a page of data stored in flash memory 103. After controller 101 has received the read data from flash memory 103 and stored the read data, in storage medium 102 for example, controller 101 may issue a command to flash memory 103 to change the read level and reissue the read command to read the page of data again using a new read level. After controller 101 has received the read data from flash memory 103 in response to the reissued read command and stored the read data, the process of changing the read level and reissuing the read command to read the page of data is repeated until the number read operations needed to identify cells falling in each of the defined regions is complete. Comparing the read data from each of the multiple read operations allows controller 101 to identify and assign each cell being read to a particular region having an assigned LLR value. For example, the particular region may be identified by determining the region bounded by the largest read level that indicates a cell is programmed and the adjacent read level that indicates the cell is unprogrammed.

Figure 2:
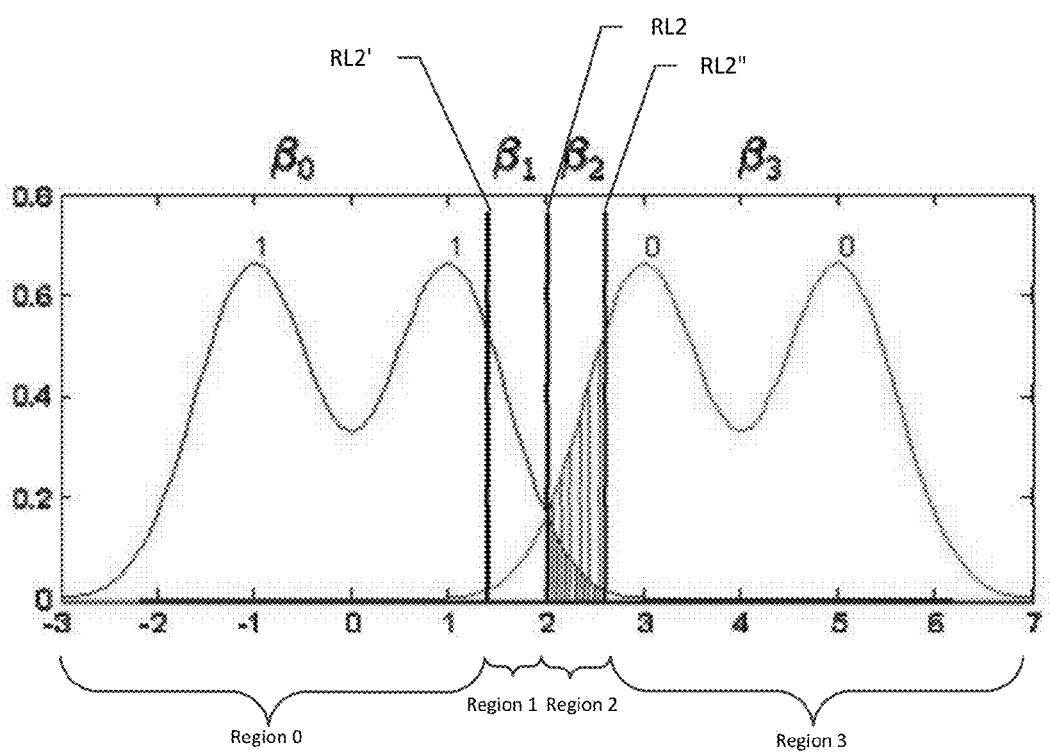
FIG. 2 is a graph illustrating an example of LLR assignments for regions of a cell probability distribution for a LSB page according to aspects of the subject technology.

FIG. 2 is a graph showing probability distributions for least-significant bit (LSB) pages in an MLC flash memory according to aspects of the subject technology. As depicted in FIG. 2, the $V_T$ axis is divided into four regions, Region 0, Region 1, Region 2, and Region 3, associated with read level 2 (RL2). The regions are defined along the $V_T$ axis based on the three read levels used to obtain the soft information (e.g., RL2, RL2', RL2"). Each of the regions is assigned a respective LLR value (e.g., $\beta_0$, $\beta_1$, $\beta_2$, $\beta_3$) for use in decoding data read from the flash memory.

The number of regions will vary depending on the number of read operations used to obtain the soft information. As depicted in FIG. 2, three read levels are used to assign cells to one of four regions along the $V_T$ axis. Five read levels would be used to assign cells to one of six regions, seven read levels would be used to assign cells to one of eight regions, etc. Using more regions provides higher accuracy to the soft information (e.g., LLR) used to decode the data. However, using more regions requires more read operations which adds latency to the overall process.

Figure 3:
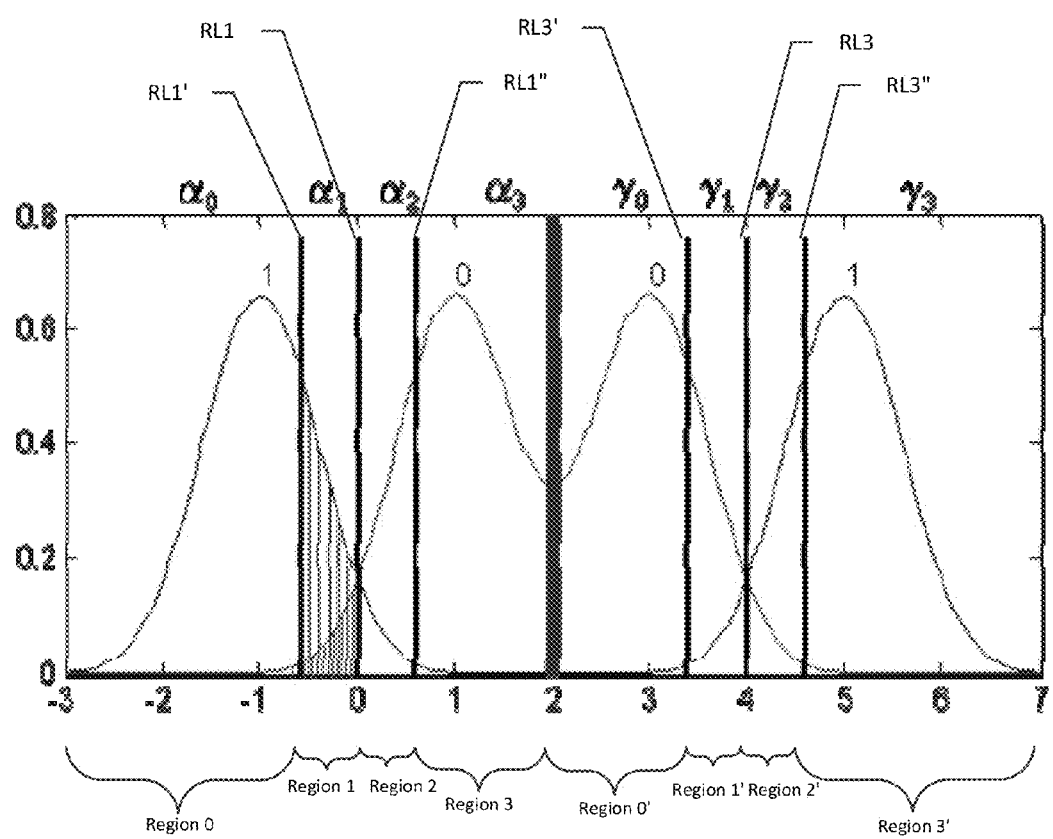
FIG. 3 is a graph illustrating an example of LLR assignments for regions of a cell probability distribution for a MSB page according to aspects of the subject technology.

FIG. 3 is a graph showing probability distributions for most-significant bit (MSB) pages in an MLC flash memory according to aspects of the subject technology. As depicted in FIG. 3, the $V_T$ axis is divided into four regions, Region 0, Region 1, Region 2, and Region 3, associated with read level 1 (RL1) and four regions, Region 0', Region 1', Region 2', and Region 3' associated with read level 3 (RL3). The regions are defined along the $V_T$ axis based on the three read levels used to obtain the soft information at the L0/L1 boundary (e.g., RL1, RL1', RL1") and the three read levels used to obtain soft information at the L2/L3 boundary (e.g., RL3, RL3', RL3").

Each of the regions depicted in FIGS. 2 and 3 is assigned a respective LLR value for use in decoding data read from the flash memory. Table 1 below provides variables representing the different LLRs assigned to each region around the different programming level boundaries (e.g., L0/L1, L1/L2, L2/L3). The respective boundaries may be represented by the initial read levels (RL1, RL2, RL3, etc.).

TABLE 1

| Boundary | LLR Values | | | |
|---|---|---|---|---|
| L0/L1 | $\alpha_0$ | $\alpha_1$ | $\alpha_2$ | $\alpha_3$ |
| L1/L2 | $\beta_0$ | $\beta_1$ | $\beta_2$ | $\beta_3$ |
| L2/L3 | $\gamma_0$ | $\gamma_1$ | $\gamma_2$ | $\gamma_3$ |

The subject technology derives an error signal during an operation phase of the flash memory device to detect read level offsets. The error signals derived during the operation phase of the device may be based on the average LLR and/or average sign values coming out of the LLR generator. Although the number of cells used to generate average LLR and average sign values can vary, as a practical limitation, use of a fewer number of cells can increase the amount of noise in the error signal estimate. In certain aspects, the number of cells used may correspond with the number of cells needed to store a single code word. Thus, for every LDPC code word read, the LLR generator may return an error signal estimate. The subject technology is not limited to this number of cells.

Of interest is the error in the shift in $V_T$ distributions (that can occur during the reading process), as compared to shifts in the $V_T$ distributions that occurred during calibration. Let $\beta_K$ be the event that a cell falls into region K and let $\beta_K$ be the LLR value assigned to region K. Further, let the probability of the occurrence of event $\beta_K$ be defined by: $P_K = \Pr(\beta_K)$. Then the average LLR can be given by:

$$\bar{\beta} = \Sigma_k \beta_k p_k \quad (1)$$

And the average sign can be calculated as:

$$\bar{s} = \Sigma_k \text{sgn}(\beta_k) p_k \quad (2)$$

For MLC flash memory storing two bits per cell, these expressions will each yield three separate values that can be tracked based on the three sets of regions associated with the three different boundaries.

In some aspects, the probabilities can be estimated by counting the number of cells that fall into each region for the LSB and MSB pages. For example, $M_{JK}$ may represent the number of cells that fall into region K of the boundary area J (e.g., L0/L1, L1/L2, L2/L3). The cell counts may be determined during a configuration phase during which test data is written to the flash memory and read out to determine the distribution of the cells in the flash memory. The cell counts also may be determined through simulations or other laboratory techniques. Table 2 shows variables representing the different cell counts.

TABLE 2

| Boundary | Cell Counts | | | |
|---|---|---|---|---|
| L0/L1 | $M_{10}$ | $M_{11}$ | $M_{12}$ | $M_{13}$ |
| L1/L2 | $M_{20}$ | $M_{21}$ | $M_{22}$ | $M_{23}$ |
| L2/L3 | $M_{30}$ | $M_{31}$ | $M_{32}$ | $M_{33}$ |

The probabilities can be estimated using the following expression:

$$P_{jk} = M_{jk} / \Sigma_k M_{jk'} \quad (3)$$

Table 3 shows variables representing the different probabilities.

TABLE 3

| Boundary | Probabilities | | | |
|---|---|---|---|---|
| L0/L1 | $p_{10}$ | $p_{11}$ | $p_{12}$ | $p_{13}$ |
| L1/L2 | $p_{20}$ | $p_{21}$ | $p_{22}$ | $p_{23}$ |
| L2/L3 | $p_{30}$ | $p_{31}$ | $p_{32}$ | $p_{33}$ |

Because of asymmetries in the distributions and in the range of allowed values for the read levels, even without an offset, average values may not equal zero. Thus, an unbiased error signal can be defined as having a mean value at zero subtracted, so that the resulting signal will be zero when the offset is zero. Each error signal can then be evaluated for varying amounts of read level offset. In order to isolate the effect of different read level offsets, it can be assumed that when reading a LSB page RL1 and RL3 will have a zero offset, while shifting RL2. Similarly, when reading a MSB page, it can be assumed that RL2 will have a zero offset, while shifting RL1 and RL3.

Figure 4:
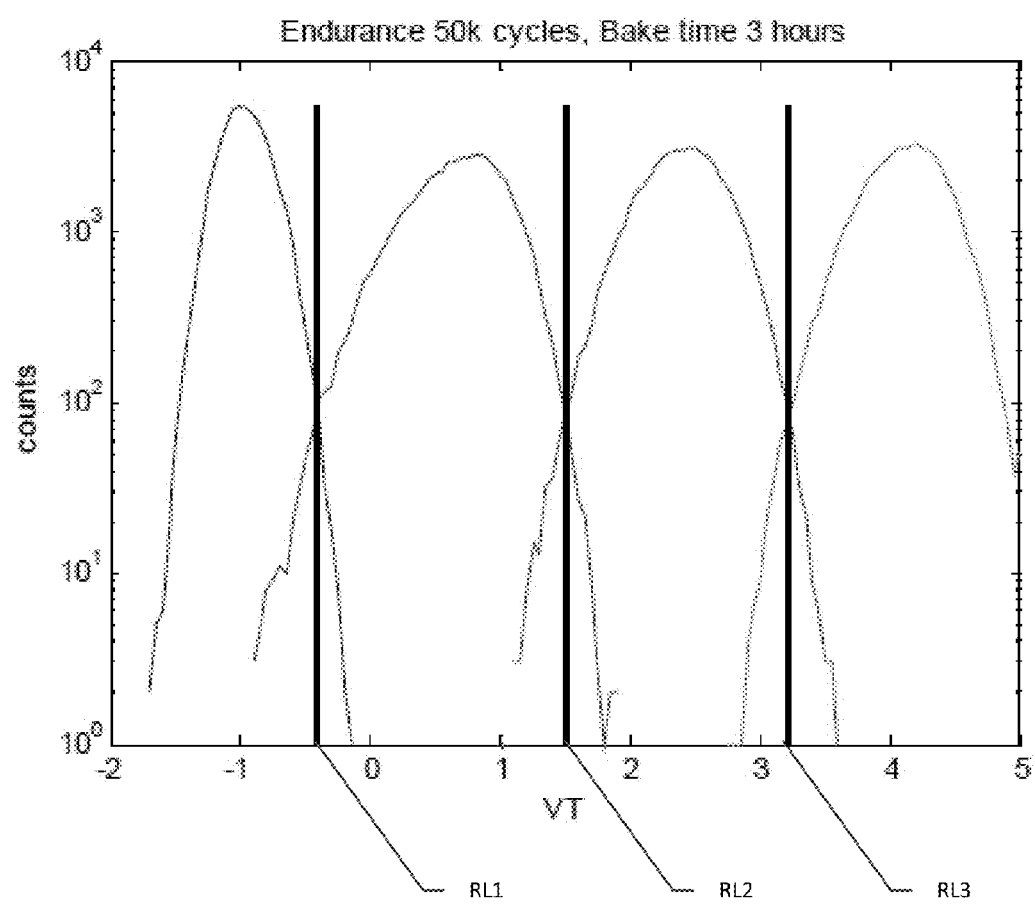
FIG. 4 is a graph illustrating a cell count distribution for a MLC flash memory according to aspects of the subject technology.

FIG. 4 illustrates an example of a $V_T$ cell count distribution for a 32 nm flash memory, with an endurance of 50 k cycles following a three hour bake time to simulate a duration of retention of data stored in the flash memory. The initial settings of the three read levels depicted in FIG. 4 (RL1, RL2, and RL3) may be determined through testing and/or simulations. Once the initial or optimal read levels have been set for RL1, RL2, and RL3, error signals using the average LLR and/or the average LLR sign may be determined for different read level offsets from the initial or optimal read levels. FIGS. 5A, 5B, 6A, 6B, 7A, 7B, 8A, and 8B depict the outcome of these determinations according to aspects of the subject technology.

Figure 5A:
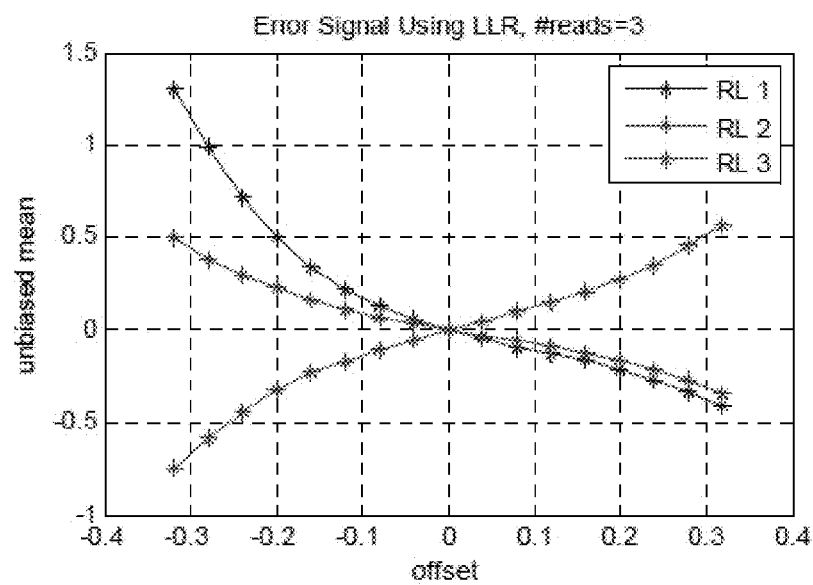
FIG. 5A illustrates an example of an error signal using an average LLR, with three reads and an endurance of 50 k cycles, for different read level offsets according to aspects of the subject technology.
Figure 5B:
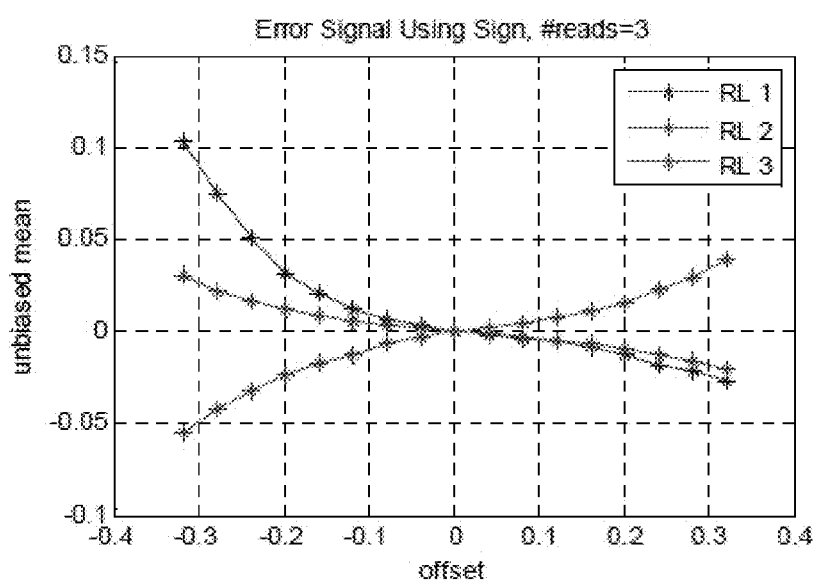
FIG. 5B illustrates an example of an error signal using an average LLR sign, with three reads and an endurance of 50 k cycles, for different read level offsets according to aspects of the subject technology.

Specifically, FIG. 5A illustrates an example of an error signal using an average LLR, with three reads and an endurance of 50 k cycles, for different read level offsets. FIG. 5B illustrates an example of an error signal using average LLR sign, with three reads and an endurance of 50 k cycles, for different read level offsets.

Figure 6A:
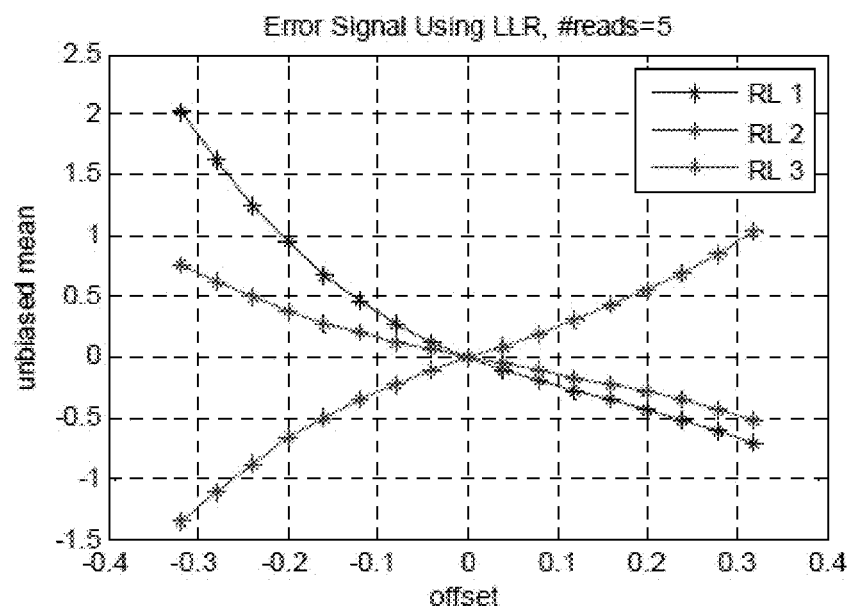
FIG. 6A illustrates an example of an error signal using an average LLR, with five reads and an endurance of 50 k cycles, for different read level offsets according to aspects of the subject technology.
Figure 6B:
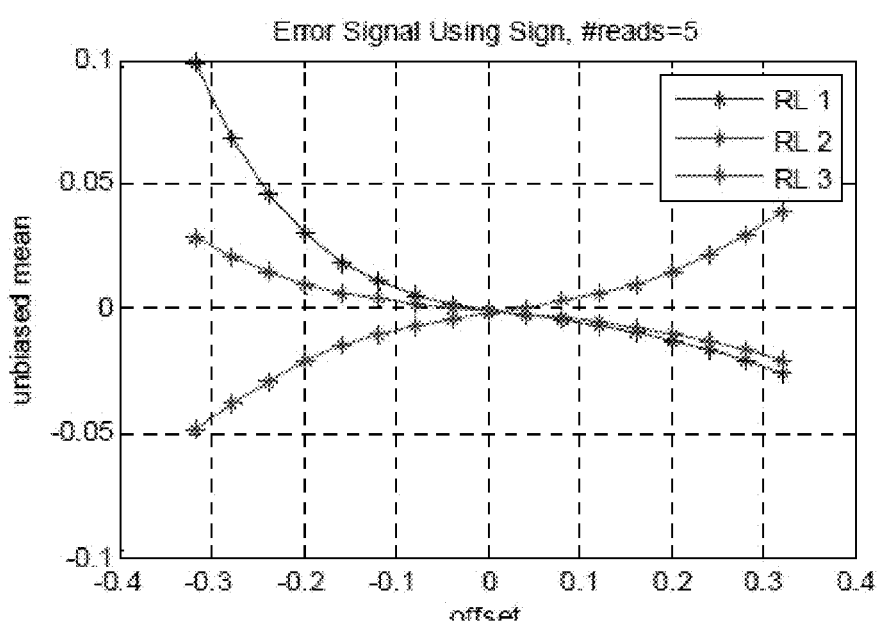
FIG. 6B illustrates an example of an error signal using an average LLR sign, with five reads and an endurance of 50 k cycles, for different read level offsets according to aspects of the subject technology.

FIG. 6A illustrates an example of an error signal using an average LLR, with five reads and an endurance of 50 k cycles, for different read level offsets. FIG. 6B illustrates an example of an error signal using average LLR sign, with five reads and an endurance of 50 k cycles or different read level offsets.

Figure 7A:
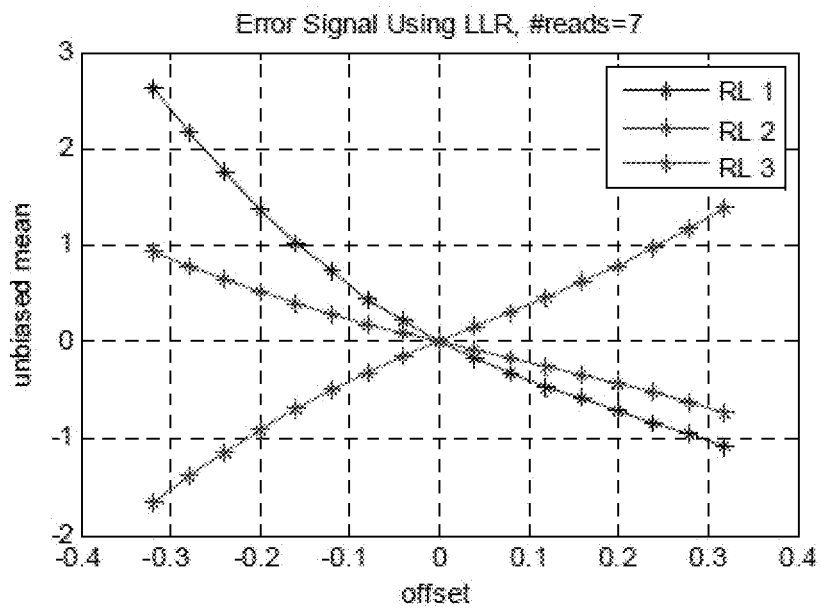
FIG. 7A illustrates an example of an error signal using an average LLR, with seven reads and an endurance of 50 k cycles, for different read level offsets according to aspects of the subject technology.
Figure 7B:
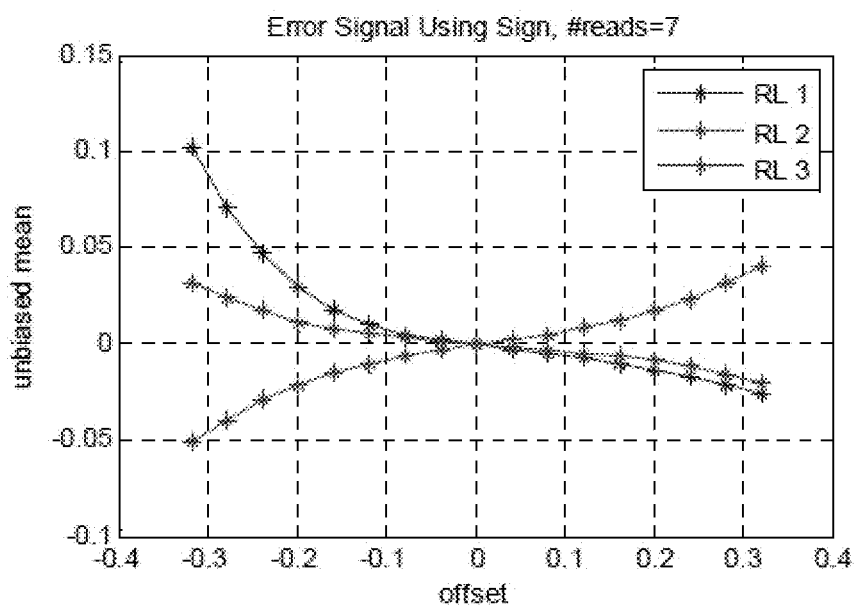
FIG. 7B illustrates an example of an error signal using an average LLR sign, with seven reads and an endurance of 50 k cycles, for different read level offsets according to aspects of the subject technology.

FIG. 7A illustrates an example of an error signal using an average LLR, with seven reads and an endurance of 50 k cycles, for different read level offsets. FIG. 7B illustrates an example of an error signal using average LLR sign, with seven reads and an endurance of 50 k cycles, for different read level offsets.

Figure 8A:
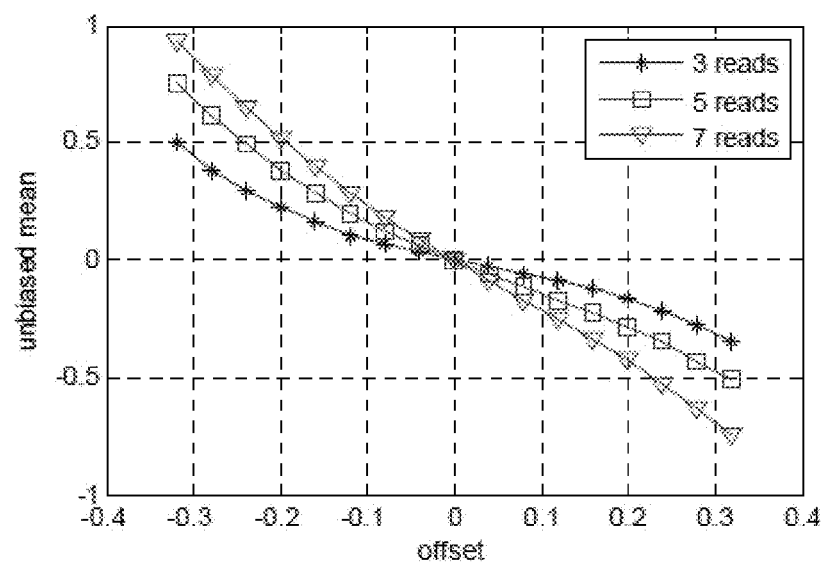
FIG. 8A illustrates an example of variation for a RL2 error signal using average LLR, for three, five and seven reads, with an endurance of 50 k cycles according to aspects of the subject technology.
Figure 8B:
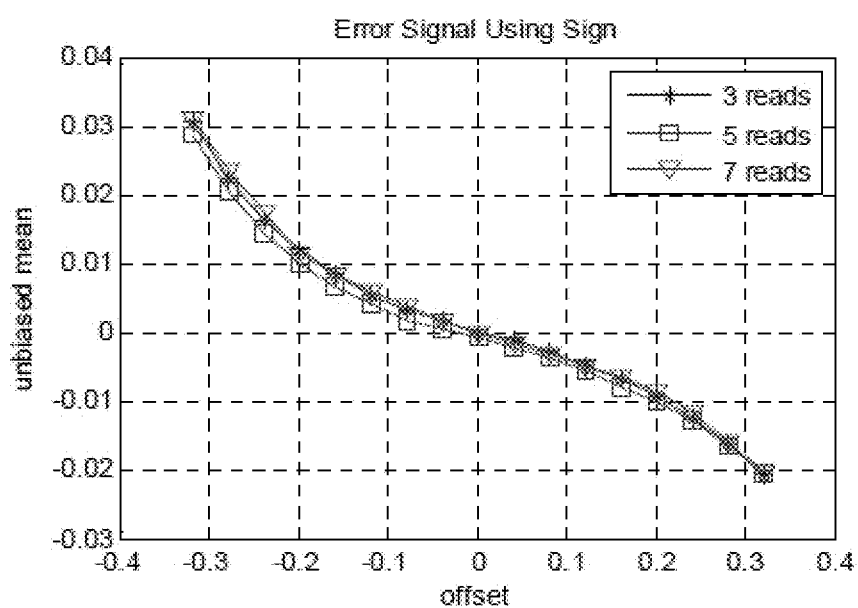
FIG. 8B illustrates an example of variation for a RL2 error signal using average LLR sign, for three, five and seven reads, with an endurance of 50 k cycles according to aspects of the subject technology.

FIG. 8A illustrates an example of variation for a RL2 error signal using average LLR, for three, five and seven reads, with an endurance of 50 k cycles. FIG. 8B illustrates an example of variation for a RL2 error signal using average LLR sign, for three, five and seven reads, with an endurance of 50 k cycles.

Using the information associating read level offsets with error signals, the controller in the flash memory device may be configured to determine an error signal during a read operation and determine a read level offset based on the determined error signal. The association of the read level offsets and the error signals may be stored as a look-up table, or multiple look-up tables, that can be referenced by the controller. The association of read level offsets and the error signals also may be represented in an equation, or set of equations, that can be executed by the controller using a given error signal to identify a read level offset to apply to a read level. The determined read level offset then may be used during subsequent read operations initiated by the controller to read out data stored in the flash memory.

Figure 9:
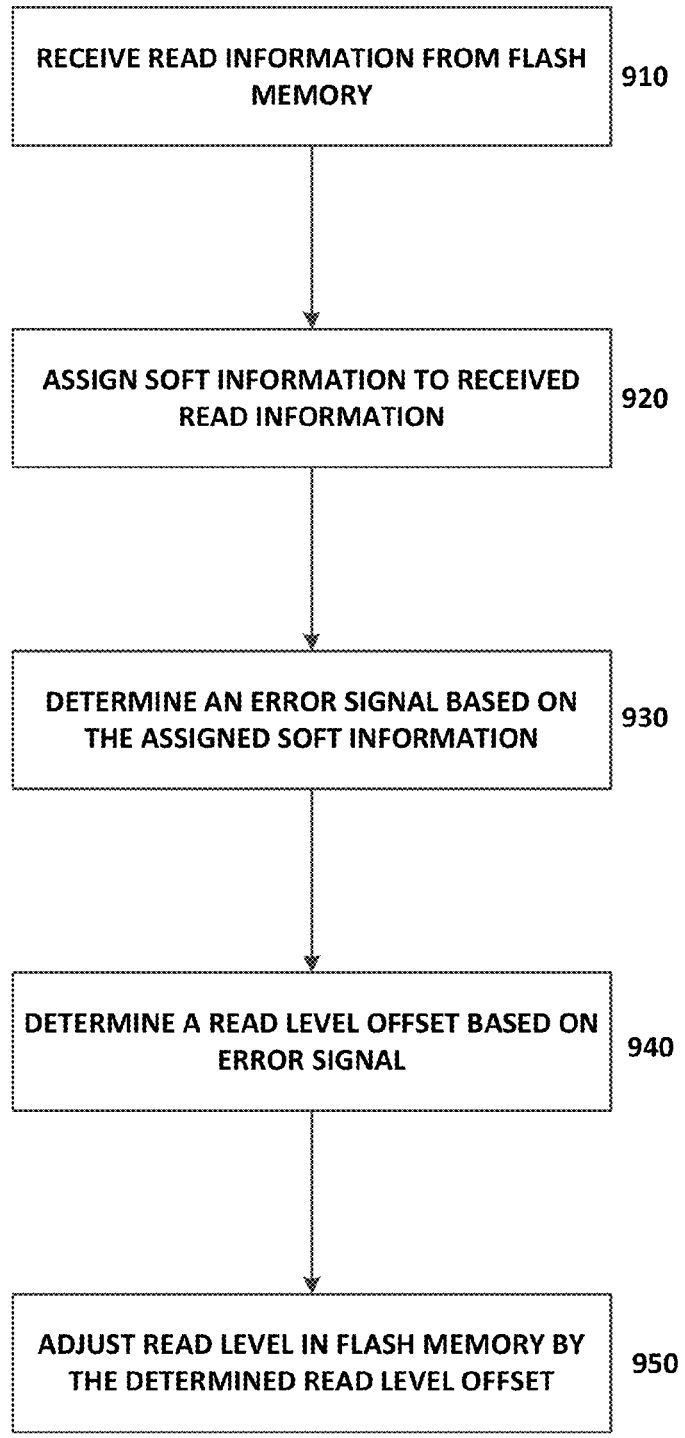
FIG. 9 is a flowchart depicting a process for calibrating read levels in a flash memory device according to aspects of the subject technology.

FIG. 9 is a flowchart illustrating a method for calibrating read levels in a flash memory device according to aspects of the subject technology. Briefly, process 900 includes receiving read information from flash memory in response to a read command in block 910, assigning soft information to the received read information in block 920, determining an error signal based on the assigned soft information in block 930, determining a read level offset based on the error signal in block 940, and adjusting a read level in flash memory by the determined read level offset in block 950. Process 900 is described in more detail below.

As noted above, process 900 represented in FIG. 9 is for calibrating read levels in a flash memory device. This process may be initiated by controller 101 under various circumstances. For example, the process may be initiated whenever soft decoding is used when reading data requested from the flash memory. The process also may be initiated when a cycle count for the flash memory device, a flash memory module within the device, and/or a block of the flash memory, reaches a threshold value. The process also may be initiated when a retention time for data stored in the flash memory device, flash memory module, and/or flash memory block, exceeds a threshold time.

In block 910, read information is received from flash memory in response to a read command issued by the controller to the flash memory. The read information may be output values received from the flash memory using multiple read operations at different respective read levels in order to determine regions of the cells being read, such as the regions shown in FIGS. 2 and 3. Accordingly, each read command issued by the controller may result in 3, 5, 7, etc. reads being performed at different read levels to obtain the read information from the flash memory.

In block 920, soft information is assigned to the received read information. According to aspects of the subject technology, the soft information includes an LLR for each cell being read. An LLR generator implemented within or in connection with the controller, may assign an LLR value to each cell being read using look-up tables containing different LLR values associated with different regions within the cell distributions, as depicted in FIGS. 2 and 3.

In block 930, an error signal based on the assigned soft information is determined. As noted above, possible error signals include an average LLR value and an average LLR sign. The error signal may be determined using the LLRs for a codeword being read and decoded. The error signal also may be determined using the LLRs for a portion of a codeword being read and decoded or using the LLRs for multiple codewords being read and decoded. For example, LLRs may be accumulated until a cycle count for the flash memory device, flash memory module, or block in flash memory have reached a threshold limit, at which time the error signal may be calculated. LLRs also may be accumulated until retention time of data stored in the flash memory device, flash memory module, or block in flash memory has exceeded a threshold time, after which the error signal may be calculated. Once the trigger for determining the error signal has been reached, these counts may be reset, or the threshold values increased to set up the next trigger event for determining the error signal.

In block 940, a read level offset is determined based on the error signal. For example, controller 101 may use one or more look-up tables to identify and select a read level offset corresponding to a given error signal. Controller 101 also may use an equation to calculate a read level offset corresponding to a given error signal. A gain value may be applied to the read level offset based on the amount of read data used to determine the error signal. For example, an error signal determined using a portion of a code word may have a gain value reducing the determined error signal by half or some other percentage/fraction. In this manner, noise in error signals determined using relatively small amounts of read data is attenuated by only applying a portion of the read level offset associated with the error signal. The amount of attenuation applied to the read level offsets may be determined using test or simulation data.

In block 950, a read level in the flash memory is adjusted by the determined read level offset. For example, using the error signal(s), controller 101 may determine read level offsets for RL1, RL2 and/or RL3. Controller 101 may then send programming commands to the flash memory to adjust the read level(s) by the determined read level offset(s). Controller 101 may adjust one, two or all three of the read levels depending on the error signals. The adjusted read levels are then used on subsequent read operations in the flash memory.

As discussed above with reference to Tables 2 and 3, cell counts for the different regions may be used to determine the probabilities used to determine the error signals. As $V_T$ distributions shift over the life of flash memory, one or more of the different regions may have fewer cells associated with the regions than were associated with the regions when the device was configured. To improve the efficacy of soft decoding using the soft information, maintaining a range of relative numbers of cells in each of the regions during read operations may be useful. The relative offsets of the different read levels used to obtain soft information (e.g., RL2, RL2', RL2") may be adjusted in a manner similar to that described above for adjusting the primary read levels RL1, RL2, and RL3. For example, similar look-up tables and/or equations may be determined and used to adjust the soft information read levels at different stages of the flash memory device's life or at different levels of error signals determined for determine read level offsets for the primary read levels.

Those of skill in the art would appreciate that the various illustrative blocks, modules, elements, components, methods, and algorithms described herein may be implemented as electronic hardware, computer software, or combinations of both. To illustrate this interchangeability of hardware and software, various illustrative blocks, modules, elements, components, methods, and algorithms have been described above generally in terms of their functionality. Whether such functionality is implemented as hardware or software depends upon the particular application and design constraints imposed on the overall system. Skilled artisans may implement the described functionality in varying ways for each particular application. Various components and blocks may be arranged differently (e.g., arranged in a different order, or partitioned in a different way) all without departing from the scope of the subject technology.

It is understood that the specific order or hierarchy of steps in the processes disclosed is presented as an illustration of some exemplary approaches. Based upon design preferences and/or other considerations, it is understood that the specific order or hierarchy of steps in the processes can be rearranged. For example, in some implementations some of the steps can be performed simultaneously. Thus the accompanying method claims present elements of the various steps in a sample order, and are not meant to be limited to the specific order or hierarchy presented.

The previous description is provided to enable any person skilled in the art to practice the various aspects described herein. The previous description provides various examples of the subject technology, and the subject technology is not limited to these examples. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the invention.

The predicate words "configured to", "operable to", and "programmed to" do not imply any particular tangible or intangible modification of a subject, but, rather, are intended to be used interchangeably. For example, a processor configured to monitor and control an operation or a component may also mean the processor being programmed to monitor and control the operation or the processor being operable to monitor and control the operation. Likewise, a processor configured to execute code can be construed as a processor programmed to execute code or operable to execute code.

A phrase such as an "aspect" does not imply that such aspect is essential to the subject technology or that such aspect applies to all configurations of the subject technology. A disclosure relating to an aspect may apply to all configurations, or one or more configurations. An aspect may provide one or more examples. A phrase such as an aspect may refer to one or more aspects and vice versa. A phrase such as an "embodiment" does not imply that such embodiment is essential to the subject technology or that such embodiment applies to all configurations of the subject technology. A disclosure relating to an embodiment may apply to all embodiments, or one or more embodiments. An embodiment may provide one or more examples. A phrase such as an "embodiment" may refer to one or more embodiments and vice versa. A phrase such as a "configuration" does not imply that such configuration is essential to the subject technology or that such configuration applies to all configurations of the subject technology. A disclosure relating to a configuration may apply to all configurations, or one or more configurations. A configuration may provide one or more examples. A phrase such as a "configuration" may refer to one or more configurations and vice versa.

The word "exemplary" is used herein to mean "serving as an example or illustration." Any aspect or design described herein as "exemplary" is not necessarily to be construed as preferred or advantageous over other aspects or designs.

What is claimed is:

1. A method for calibrating read levels in a flash memory device comprising:
   receiving read information from flash memory for a plurality of cells in the flash memory in response to a read command;
   assigning soft information comprising a log likelihood ratio to the received read information for each of the plurality of cells;
   determining an error signal based on the assigned log likelihood ratios;
   determining a read level offset based on the error signal; and
   adjusting a read level in the flash memory by the determined read level offset.

2. The method of claim 1, wherein determining the error signal comprises calculating an average log likelihood ratio for the plurality of cells in the flash memory.

3. The method of claim 1, wherein determining the error signal comprises calculating an average sign for the log likelihood ratios of the plurality of cells in the flash memory.

4. The method of claim 1, further comprising:
   receiving read information from the flash memory for another plurality of cells in response to a plurality of read commands;
   assigning soft information to the received read information for each of the other plurality of cells responsive to the plurality of read commands; and
   accumulating the assigned soft information,
   wherein the error signal is determined based on the accumulated soft information.

5. The method of claim 4, further comprising:
   determining a cycle count for the flash memory,
   wherein the error signal is determined based on the accumulated soft information if the cycle count is greater than a threshold value.

6. The method of claim 4, further comprising:
   determining a retention time for data stored in the flash memory,
   wherein the error signal is determined based on the accumulated soft information if the retention time is greater than a threshold time.

7. The method of claim 1, wherein determining a read level offset comprises identifying the read level offset associated with the determined error signal in a look-up table.

8. A flash memory device comprising:
   flash memory; and
   a controller configured to:
      send a read command to the flash memory;
      receive read information from the flash memory for a plurality of cells in the flash memory in response to the read command;
      assign soft information comprising a log likelihood ratio to the received read information for each of the plurality of cells;
      determine an error signal based on the assigned log likelihood ratios;
      determine a read level offset based on the error signal; and
      adjust a read level in the flash memory by the determined read level offset.

9. The flash memory device of claim 8,
   wherein the controller comprises a log likelihood generator configured to receive the read information from the flash memory for another plurality of cells and assign the soft information to the received read information for each of the other plurality of cells.

10. The flash memory device of claim 9, wherein the controller is configured to determine the error signal by calculating an average log likelihood ratio for the plurality of cells in the flash memory.

11. The flash memory device of claim 9, wherein the controller is configured to determine the error signal by calculating an average sign for the log likelihood ratios of the plurality of cells in the flash memory.

12. The flash memory device of claim 9, wherein the controller is further configured to:
   send a plurality of read commands to the flash memory;
   receive read information for another plurality of cells in the flash memory in response to the plurality of read commands;
   assign soft information to the received read information for each of the other plurality of cells responsive to the plurality of read commands;
   accumulate the assigned soft information; and
   determine the error signal based on the accumulated soft information.

13. The flash memory device of claim 12, wherein the controller is further configured to determine a cycle count for the flash memory,
   wherein the controller is configured to determine the error signal based on the accumulated soft information if the cycle count is greater than a threshold value.

14. The flash memory device of claim 12, wherein the controller is further configured to determine a retention time for data stored in the flash memory,
   wherein the controller is configured to determine the error signal based on the accumulated soft information if the retention time is greater than a threshold time.

15. The flash memory device of claim 8, wherein the controller is configured to determine the read level offset by identifying the read level offset associated with the error signal in a look-up table.

16. A non-transitory machine-readable medium having instructions stored thereon which, when executed by a processor, cause the processor to perform operations for:

receiving read information for a plurality of cells in flash memory in response to a read command;

assigning a log likelihood ratio to the received read information for each of the plurality of cells in the flash memory;

determining an error signal based on the assigned log likelihood ratios;

determining a read level offset based on the error signal; and adjusting a read level in the flash memory by the determined read level offset.

17. The non-transitory machine-readable medium of claim 16, wherein determining the error signal comprises calculating an average log likelihood ratio for the plurality of cells in the flash memory.

18. The non-transitory machine-readable medium of claim 16, wherein determining the error signal comprises calculating an average sign for the log likelihood ratios of the plurality of cells in the flash memory.

19. The non-transitory machine-readable medium of claim 16, wherein the operations further comprise:

receiving read information for another plurality of cells in the flash memory in response to a plurality of read commands;

assigning soft information for each of the other plurality of cells in the flash memory responsive to the plurality of read commands; and accumulating the assigned soft information, wherein the error signal is determined based on the accumulated soft information.

* * * * *